United States Patent [19]

Kobayashi et al.

[11] Patent Number: 4,781,969
[45] Date of Patent: Nov. 1, 1988

[54] FLEXIBLE PRINTED CIRCUIT BOARD

[75] Inventors: Satoru Kobayashi; Tetsuya Hirose, both of Hitaka; Masahiro Suzuki, Kotesashi, all of Japan

[73] Assignee: Junkosha Co., Ltd., Tokyo, Japan

[21] Appl. No.: 102,033

[22] Filed: Sep. 29, 1987

[30] Foreign Application Priority Data

Oct. 3, 1986 [JP] Japan .................... 61-235839

[51] Int. Cl.$^4$ .................... B32B 9/00; B22F 3/00; B22C 23/22
[52] U.S. Cl. .................... 428/209; 428/545; 428/567; 428/596; 428/601; 428/615; 428/650; 428/901; 174/52 FP; 174/68.5; 156/902; 29/829; 361/398
[58] Field of Search ............... 428/209, 545, 567, 596, 428/601, 615, 617, 618, 620, 621, 624, 625, 626, 650, 901, 654; 174/52 FP, 68.5; 29/829; 361/398

[56] References Cited

U.S. PATENT DOCUMENTS 4,521,476 6/1985 Asai et al. .................... 428/209
4,568,413 2/1986 Toth et al. .................... 156/151
4,633,035 12/1986 McMonogle .................... 174/68.5

OTHER PUBLICATIONS

IBM Tech. Disclosure Bulletin, vol. 12, No. 4, 9-69, p. 559, Rounded Plate Through Holes, Sparrhake.

Primary Examiner—John E. Kittle
Assistant Examiner—P. J. Ryan
Attorney, Agent, or Firm—Mortenson & Uebler

[57] ABSTRACT

A printed circuit board is provided wherein a composite metal layer is affixed to at least one surface of a flexible dielectric substrate, the composite metal layer comprising an inner aluminum layer and an outer copper layer. Owing to the relatively high elongation of the aluminum layer, when the printed circuit board is flexed the circuit thereon does not crack.

2 Claims, 1 Drawing Sheet

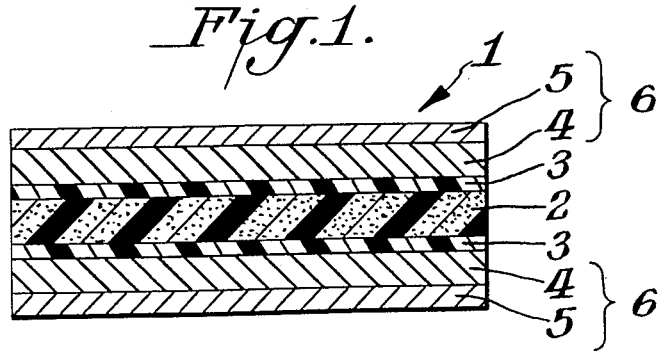
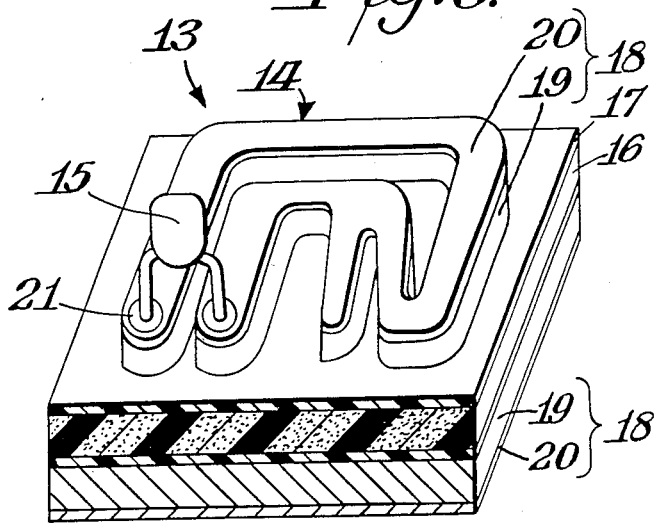
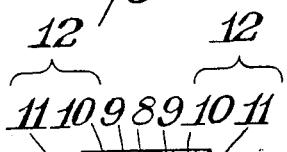
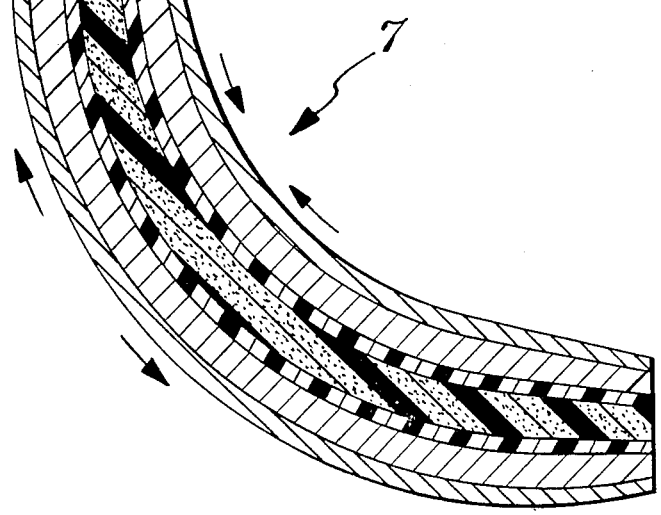

FLEXIBLE PRINTED CIRCUIT BOARD

BACKGROUND OF THE INVENTION

The present invention relates to improved substrates for printed circuit boards and to printed circuit boards for high-frequency applications such as microwave and milliwave applications.

In Japanese Patent Application No. 59-72,472, the applicant has proposed a substrate for a printed circuit board for high-frequency application which is characterized by small coefficients of thermal deformation, such as thermal expansion or shrinkage. This substrate is provided with an insulating layer which comprises a porous polytetrafluoroethylene resin element affixed to a polytetrafluoroethylene layer. It is known from Japanese Patent Publication (Kokai) No. 60-225,750 that electrical characteristics of substrates for printed circuit boards can be improved by arranging expanded porous polytetrafluoroethylene resin layers along conductive circuits. Such substrates for printed circuit boards, however, had conductive layers made of copper on both sides of a dielectric substrate, and, when they were subjected to bending, it became impossible to relieve stress caused by bending of the printed circuit board itself. As a result, cracks appeared in the conductive cooper layer.

It is an object of the present invention to eliminate the above disadvantages and to provide a substrate for a printed circuit board, with conductive layers on both sides of a dielectric body, in which, even under bending conditions of the printed circuit board substrate, it is possible to relieve the stress caused by bending and to prevent formation of cracks in the conductive layers as well.

SUMMARY OF THE INVENTION

A substrate for a printed circuit board is provided comprising a composite metal layer affixed to at least one surface of a flexible dielectric substrate, the composite metal layer comprising an inner aluminum layer and outer copper layer. The printed circuit board formed from the aforesaid substrate is also provided.

BRIEF DESCRIPTION OF THE DRAWINGS

FIG. 1 is a cross-sectional view of one embodiment of a printed circuit board substrate in accordance with the invention.

FIG. 2 is a cross-sectional view of a printed circuit board substrate in accordance with the invention in a bent state.

FIG. 3 is a perspective view, partly in cross section, of a printed circuit board in accordance with the invention.

DETAILED DESCRIPTION OF THE INVENTION AND PREFERRED EMBODIMENTS WITH REFERENCE TO THE DRAWINGS

A printed circuit board is provided wherein a composite metal layer is affixed to at least one surface of a flexible dielectric substrate, the composite metal layer comprising an inner aluminum layer and an outer copper layer. Owing to the relatively high elongation of the aluminum layer, when the printed circuit board is flexed the circuit thereon does not crack.

The problem inherent in the prior art techniques of forming printed circuit boards is solved by means of the substrate for a printed circuit board formed of a flexible dielectric layer and a metal layer attached to at least one side of the above mentioned flexible dielectric layer, the metal layer having an aluminum layer on the inner side and a copper layer attached to the outer surface of the aluminum layer.

Because, according to the invention, a conductive layer which is installed at least on one side of a flexible dielectric layer is formed of a layer of aluminum on the side of the dielectric and a layer of copper on the outer surface of the aluminum layer, stress which is generated by bending the printed circuit board does not form cracks because this stress is absorbed by the aluminum, which is characterized by high relative elongation.

In addition, although aluminum is a metal which cannot be easily attached by soldering, because in the printed circuit of the invention, one side of the aluminum layer is coated with an easily soldered copper layer and because this copper layer forms the outermost surface of the substrate for the printed circuit board, it provides improved conditions for attachment of various circuit elements to the printed circuit board substrate.

FIG. 1 is a cross-sectional view of a printed circuit board substrate made in accordance with one embodiment of the present invention. The printed circuit board substrate shown in this figure comprises a flexible dielectric layer 2 preferably made of expanded, porous polytetrafluoroethylene, which is sandwiched via adhesive layers 3, 3 such as a film of ethylene tetrafluoroethylene between conductive layers 6, 6 located on both its side and formed each from a sequentially arranged aluminum layer 4, 4 and a copper layer 5, 5.

FIG. 2 is a cross-sectional view of a printed circuit board substrate 7 of the invention when the substrate is in a bent state. The strains, which at this moment work in printed circuit board substrate 7, are shown by the arrows. As shown in FIG. 2, when printed circuit board substrate 7 is bent, strains indicated by the arrows are generated. These strains cause stresses in metal layers 12, but because the stresses have greater value on the sides of flexible dielectric layer 8 which, through adhesive layers 9 contacts aluminum layers 10, the stresses which work in the direction of the arrows are substantially absorbed by deformation of aluminum layers 10. As copper layers 11 are thin, they are easily adjusted to the deformation of the aluminum layers and are not subject to cracking. Even though local cracks can occur, the printed circuit board substrate will not lose its performance characteristics since conductivity will still be maintained through the aluminum layers.

FIG. 3 is a perspective view of a printed circuit board 13 with a circuit pattern 14 installed in the printed circuit board substrate and with an element 15 soldered to the above mentioned pattern. In the case when an element such as element 15 is attached by soldering to circuit 14 of printed circuit board 13 of the type shown in FIG. 3, metal layers 18 which are attached to both sides of a flexible dielectric layer 16 via adhesive layers 18 are formed of aluminum layers 19 on the side which is closer to the flexible dielectric layer 16, while their outermost layers 20 are formed of copper. Because the outer layers are made of copper, various elements can easily be soldered through solders 21 to the printed circuit board with the same ease as in the case of conventional printed circuit boards.

Because, as has been shown above, the structure made in accordance with the invention has metal layers installed on one or both sides of a flexible dielectric layer with aluminum layers located closer to the above mentioned dielectric layer and with copper layers located on the outer sides of the aluminum layers, the stresses which are formed in the printed circuit board in the case of its bending are effectively absorbed by the aluminum layers due to their specific properties. As a result, the stresses are relieved and the metal layer is protected from the formation of cracks.

As is known, aluminum is a material which is unsuitable for soldering. Therefore, it is very difficult to connect various elements directly to the aluminum surface. Because, in the device of the invention, the aluminum surfaces are coated by copper layers which form the outer surfaces of the printed circuit board substrate, various elements can be easily attached to the board by soldering in the same manner as in the case of conventional printed circuit board substrates.

As has been mentioned above, the printed circuit board substrate of the invention is free of disadvantages inherent in conventional printed circuit board substrates, possesses flexibility, improves compactness in mounting wiring element, and increases durability and reliability of operation.

The invention is not limited to the above described embodiment. For example, the invention covers different methods of connection between the flexible dielectric layer and metal layers, as well as different structures of the metal layers. Therefore, various modifications are possible without departure from the spirit of the invention.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. A flexible printed circuit board comprising a composite metal circuit affixed to at least one surface of a flexible dielectric substrate, said composite circuit comprising an inner aluminum layer adjacent said flexible dielectric substrate and an outer copper layer adjacent said aluminum layer.

2. The flexible printed circuit board of claim 1 wherein said flexible dielectric substrate comprises a layer of porous, expanded polytetrafluoroethylene, said substrate sandwiched between said metal circuit affixed on either side of said substrate by means of a film of ethylene tetrafluoroethylene adhesive.

* * * * *